United States Patent
Deng (10) Patent No.: US 11,476,687 B2
(45) Date of Patent: Oct. 18, 2022

(54) POWER INDICATION CIRCUIT AND POWER INDICATION METHOD

(71) Applicant: Silergy Semiconductor Technology (Hangzhou) LTD, Hangzhou (CN)

(72) Inventor: Fuhua Deng, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 232 days.

(21) Appl. No.: 16/883,512

(22) Filed: May 26, 2020

(65) Prior Publication Data
US 2020/0389040 A1  Dec. 10, 2020

(30) Foreign Application Priority Data

Jun. 4, 2019  (CN) .......................... 201910480781.1

(51) Int. Cl.
| | |
|---|---|
| *G08B 21/00* | (2006.01) |
| *H02J 7/00* | (2006.01) |
| *G01R 31/36* | (2020.01) |
| *G01R 31/388* | (2019.01) |

(52) U.S. Cl.
CPC ........ *H02J 7/0047* (2013.01); *G01R 31/3646* (2019.01); *G01R 31/388* (2019.01)

(58) Field of Classification Search
CPC ............... H02J 7/0047; H02J 7/007184; H02J 7/00711; H02J 2207/20; H02J 7/007182; H02J 7/00714; G01R 31/3646; G01R 31/388; G01R 19/16542; G01R 19/16595; H02M 3/158

USPC ... 340/636.12, 636.1, 636.15, 636.19, 636.2, 340/635

See application file for complete search history.

(56) References Cited

U.S. PATENT DOCUMENTS

| | | | | |
|---|---|---|---|---|
| 4,876,632 A | * | 10/1989 | Osterhout | ............ G01R 31/385 362/208 |
| 6,118,384 A | * | 9/2000 | Sheldon | .................... G06F 1/24 324/426 |
| 8,443,130 B2 | * | 5/2013 | Xie | ........................ G06F 1/266 714/25 |
| 8,450,979 B2 | | 5/2013 | Kerr et al. | |
| 9,479,060 B2 | | 10/2016 | Deng | |
| 9,559,542 B2 | | 1/2017 | Deng | |
| 9,654,005 B2 | | 5/2017 | Deng | |
| 9,716,434 B2 | | 7/2017 | Deng | |

(Continued)

FOREIGN PATENT DOCUMENTS

CN  101718844 A  12/2009

*Primary Examiner* — Anh V La (57) ABSTRACT

A power indication circuit for indicating different power levels of a battery, can include: N LED indicators; N setting resistors; N multifunction ports; a drive circuit coupled to the N multifunction ports and the battery, and being configured to acquire N threshold voltage signals in accordance with voltages at the N multifunction ports during a first time period of an operation cycle, and to generate N comparison signals in accordance with the N threshold voltage signals and a voltage detection signal generated by detecting a voltage of the battery, in order to drive the N LED indicators in accordance with the N comparison signals during a second time period of the operation cycle; and where each of the N setting resistors coupled in parallel to a corresponding one of the N LED indicators is respectively coupled to a corresponding one of the N multifunction ports.

19 Claims, 11 Drawing Sheets

(56) References Cited

U.S. PATENT DOCUMENTS

| | | | |
|---|---|---|---|
| 9,769,888 B2* | 9/2017 | Wang | H05B 45/3725 |
| 9,819,270 B2 | 11/2017 | Deng | |
| 2004/0046673 A1* | 3/2004 | Kovarik | G01R 31/388 |
| | | | 324/435 |
| 2008/0231233 A1 | 9/2008 | Thornton | |
| 2010/0289551 A1* | 11/2010 | Bjorklund | G01R 31/31711 |
| | | | 702/57 |
| 2012/0049853 A1* | 3/2012 | Xie | G01R 31/388 |
| | | | 324/427 |
| 2014/0152239 A1 | 6/2014 | Yao et al. | |
| 2014/0203763 A1 | 7/2014 | Zhao et al. | |
| 2016/0233713 A1 | 8/2016 | Cheng | |

\* cited by examiner

FIG. 1 (conventional)

POWER INDICATION CIRCUIT AND POWER INDICATION METHOD

RELATED APPLICATIONS

This application claims the benefit of Chinese Patent Application No. 201910480781.1, filed on Jun. 4, 2019, which is incorporated herein by reference in its entirety.

FIELD OF THE INVENTION

The present invention generally relates to the field of power electronics, and more particularly to power indication circuits and methods.

BACKGROUND

Figure 1:
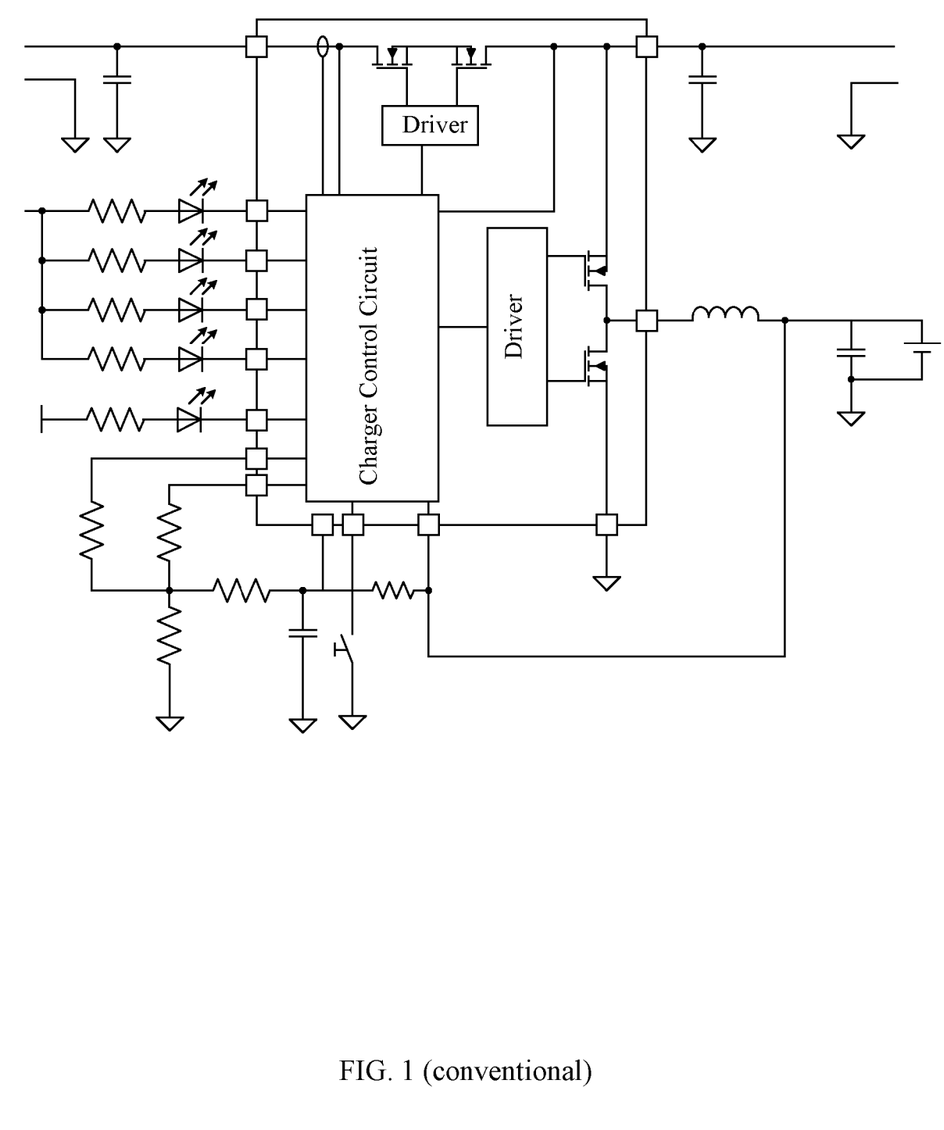
FIG. 1 is a schematic block diagram of an example battery management integrated circuit.

Currently, a battery management module with a small package is typically required for mobile devices, which limits the number of pins of an integrated circuit (IC). As shown in FIG. 1, most small package battery management ICs do not have corresponding programming pins for power levels thresholds due to the limitation of the number of pins, for example, a charger control circuit shown in FIG. 1. For different batteries, it may be necessary to provide battery management ICs with a small package and different power level thresholds. However, if the pin for adjusting the power level threshold is added to the small-package battery management IC, the size of the battery management IC increases, thereby increasing manufacturing costs.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

In one embodiment, a power indication circuit for indicating different power levels of a battery, can include: (i) N light-emitting diode (LED) indicators, where N is positive integer; (ii) N setting resistors; (iii) N multifunction ports; (iv) a drive circuit coupled to the N multifunction ports and the battery, and being configured to acquire N threshold voltage signals in accordance with voltages at the N multifunction ports during a first time period of an operation cycle, and to generate N comparison signals in accordance with the N threshold voltage signals and a voltage detection signal generated by detecting a voltage of the battery, in order to drive the N LED indicators in accordance with the N comparison signals during a second time period of the operation cycle; and (v) where each of the N setting resistors coupled in parallel to a corresponding one of the N LED indicators is respectively coupled to a corresponding one of the N multifunction ports.

Figure 2:
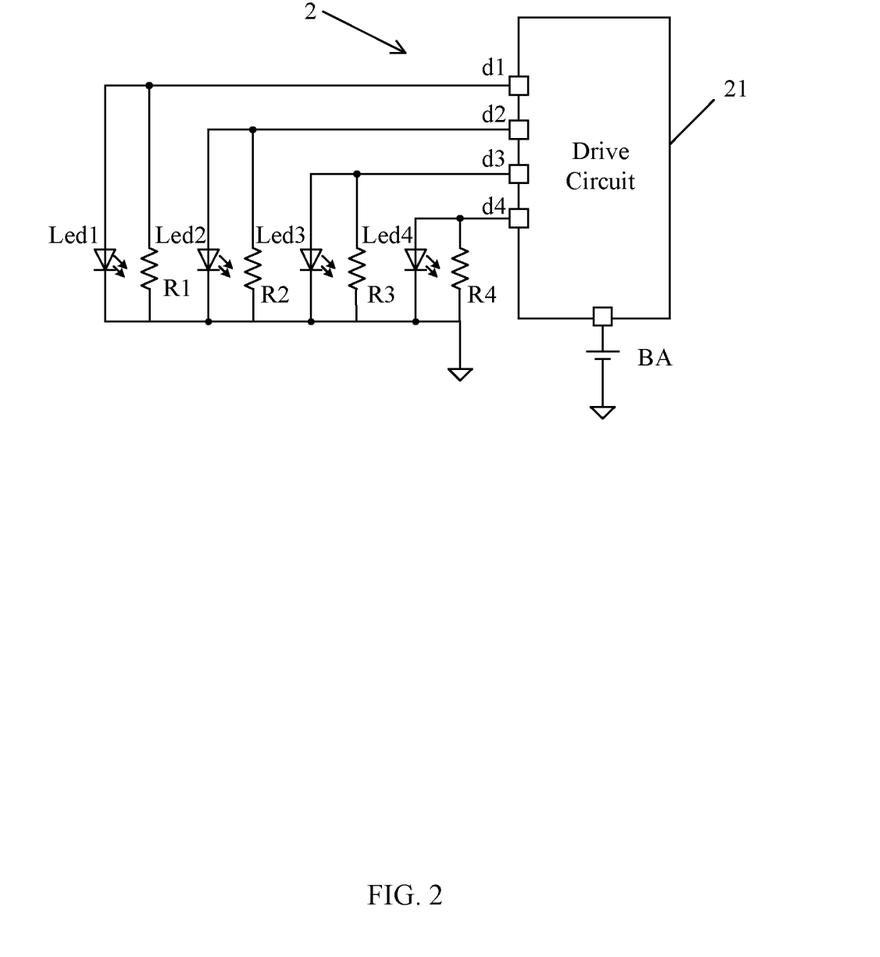
FIG. 2 is a schematic block diagram of a first example power indication circuit, in accordance with embodiments of the preset invention.

Referring now to FIG. 2, shown is a schematic block diagram of a first example power indication circuit, in accordance with embodiments of the preset invention. In this particular example, power indication circuit 2 can include N light-emitting diode (LED) indicators, N setting resistors, N multifunction ports, and a drive circuit, where N is greater than or equal to 1. For example, power indication circuit 2 can include four LED indicators Led1-Led4, four setting resistors R1-R4, four multifunction ports d1-d4, and drive circuit 21. The parallel-connected LED indicator Led1 and setting resistor R1 can connect to multifunction port d1, the parallel-connected LED indicator Led2 and setting resistor R2 can connect to multifunction port d2, the parallel-connected LED indicator Led3 and setting resistor R3 can connect to multifunction port d3, and the parallel-connected LED indicator Led4 and setting resistor R4 can connect to multifunction port d4.

Drive circuit 21 can connect to multifunction ports d1-d4 and battery BA. Drive circuit 21 can acquire four threshold voltage signals according to the voltages at multifunction ports d1-d4 during a first time period of an operation cycle, and can generate four comparison signals in accordance with the four threshold voltage signals and a voltage detection signal that is generated by detecting a voltage of battery BA, in order to drive LED indicators Led1-Led4 according to the four comparison signals in a second time period of the operation cycle. In this way, one or more of four LED indicators Led1-Led4 may illuminate to provide a visual indication of the current power lever of battery BA. A number of the LED indicators lighted correspond to a corresponding power level of battery BA in a one-to-one relationship. Therefore, the drive circuit as an integrated circuit can share pins (e.g., multifunction ports d1-d4) at different time periods, and the integrated circuit is suitable for batteries with different types and capacities on the premise of not increasing the pins, thereby reducing manufacturing costs.

Figure 3:
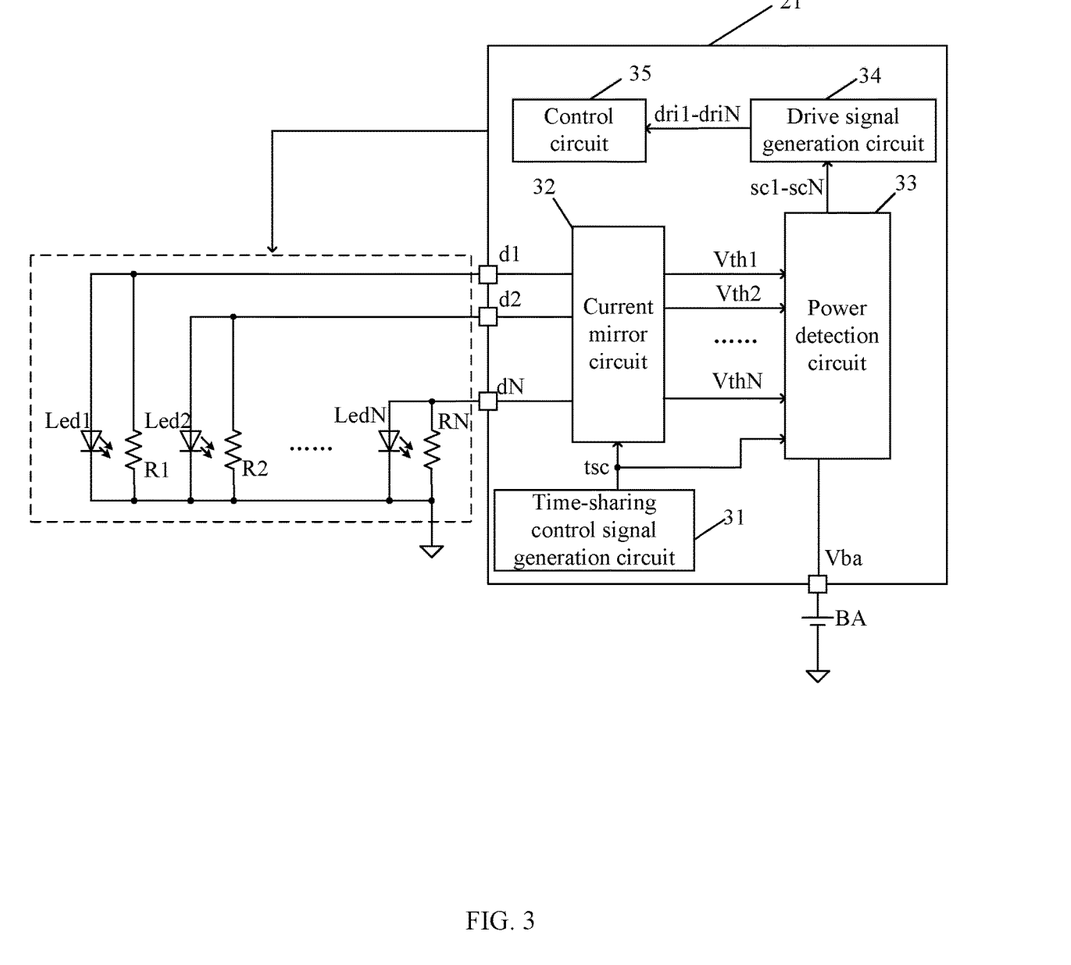
FIG. 3 is a schematic block diagram of a second example power indication circuit, in accordance with embodiments of the preset invention.

Referring now to FIG. 3, shown is a schematic block diagram of a second example power indication circuit, in accordance with embodiments of the preset invention. This example power indication circuit can include N LED indicators, N setting resistors, N multifunction ports, and a drive circuit, where N is an integer that is greater than or equal to 1. This example drive circuit 21 can include time-sharing control signal generation circuit 31, current mirror circuit 32, power detection circuit 33, drive signal generation circuit 34, and control circuit 35. In this particular example, time-sharing control signal generation circuit 31 can generate time-sharing control signal tsc.

Figure 4:
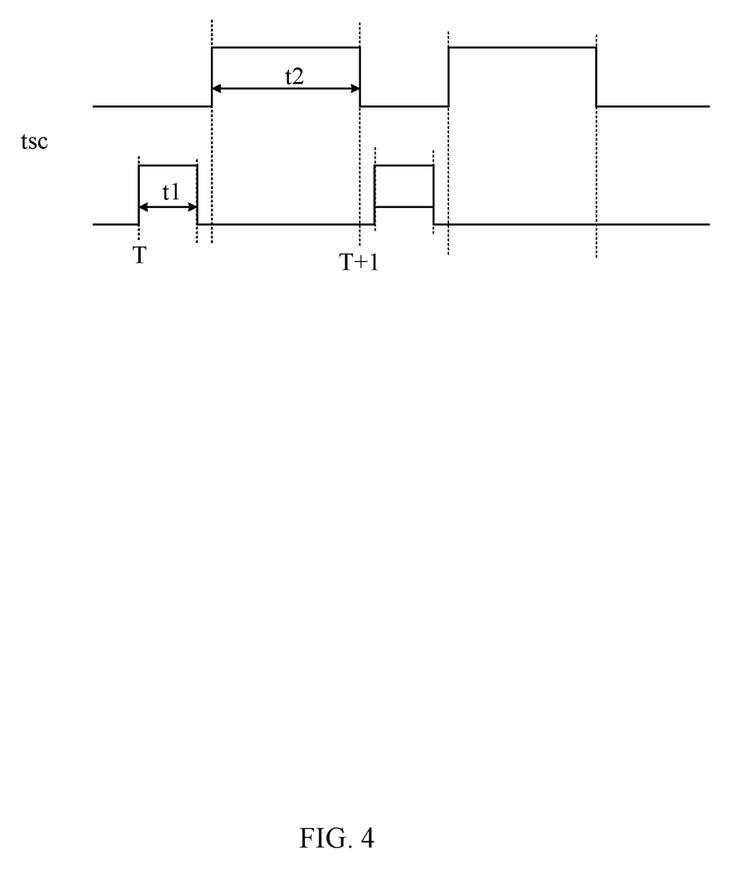
FIG. 4 is a waveform diagram of an example time-sharing control signal, in accordance with embodiments of the preset invention.

Referring now to FIG. 4, shown is a waveform diagram of an example time-sharing control signal, in accordance with embodiments of the preset invention. Time-sharing control signal tsc can include two time periods (e.g., first time period t1 and second time period t2) during each operation cycle. In particular embodiments, current mirror circuit 32 and power detection circuit 33 are controlled to operate by time-sharing control signal tsc in first time period t1, and in second time period t2 control circuit 35 is controlled by time-sharing control signal tsc to drive LED indicators Led1-LedN. Further, current mirror circuit 32 can adjust voltages Vled1-VledN at N multifunction ports d1-dN in first time period t1, in order to acquire N threshold voltage signals Vth1-VthN.

Power detection circuit 33 can compare N threshold voltage signals Vth1-VthN against voltage detection signal Vba respectively in first time period t1, in order to generate comparison signals sc1-scN. Drive signal generation circuit 34 can generate drive signals dri1-driN according to comparison signals sc1-scN in first time period t1. In another example, drive signal generation circuit 34 can generate drive signals dri1-driN according to comparison signals sc1-scN in second time period t2. Further, control circuit 35 can drive LED indicators Led1-LedN according to drive signals dri1-driN in second time period t2, thereby indicating the current power state of battery BA according to LED indicators Led1-LedN.

In particular embodiments, current mirror circuit 32 can include N branches respectively connected to corresponding multifunction ports, in order to generate N currents, and each current flows through the corresponding multifunction port. Since the parallel-connected LED indicator Ledn and setting resistor Rn are connected to multifunction port dn, the voltage at multifunction port dn can be determined by corresponding setting resistor Rn and the corresponding current, where n is not less than 1 and not greater than N. Current mirror circuit 32 may be controlled by time-sharing control signal tsc to be at an operation state during first time period t1 and to be at an off state during second time period t2. Power detection circuit 33 can compare N threshold voltage signals Vth1-VthN and voltage detection signal Vba of the battery to generate comparison signals sc1-scN, respectively. Drive signal generation circuit 34 can generate N drive signals dri1-driN based on N comparison signals. Control circuit 35 can drive LED indicators Led1-LedN according to drive signals dri1-driN, respectively, in order to indicate the current power lever of battery BA.

In particular embodiments, voltages Vled1-Vledn at multifunction ports d1-dn can be configured as N threshold voltage signals Vth1-VthN directly. In another example, N threshold voltage signals Vth1-VthN can be acquired by adding voltages Vled1-Vledn at multifunction ports d1-dn to N preset initial thresholds, respectively. Therefore, the detection deviation caused by circuit errors can be reduced, and the accuracy of power indication of the battery can be improved.

The various embodiments can obtain N threshold voltage signals in accordance with voltages Vled1-Vledn at multifunction ports d1-dn in the first time period, and N comparison signals are determined according to N threshold voltage signals and voltage detection signal Vba of the battery by utilizing time-sharing control signal tsc. N LED indicators Led1-LedN are controlled according to N comparison signals in the second time period, thereby indicating the current power lever of battery BA. Therefore, the drive circuit as an integrated circuit can share pins (e.g., multifunction ports d1-d4) at different time periods, and the integrated circuit is suitable for batteries with different types and capacities on the premise of not increasing the pins, thereby reducing manufacturing costs.

Figure 5:
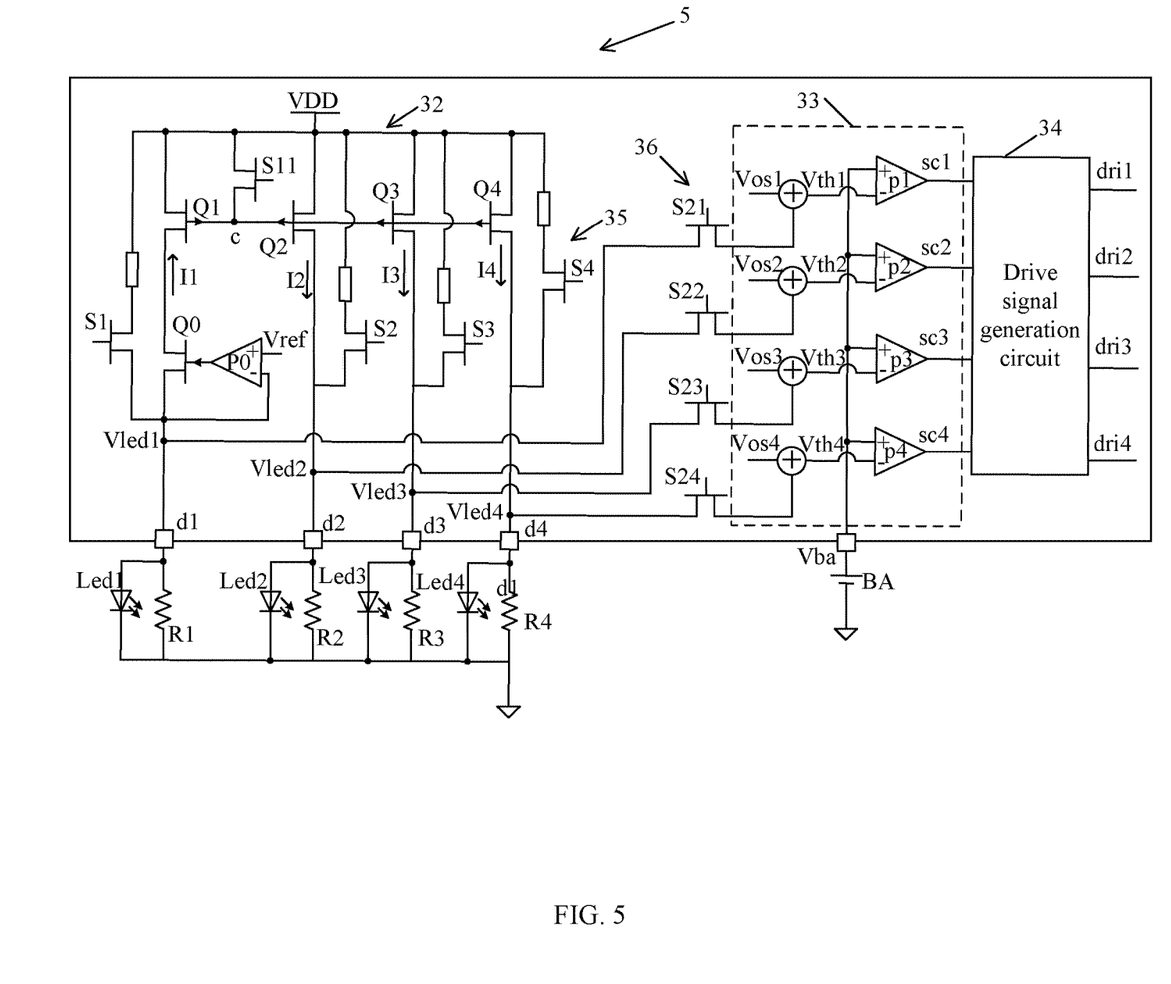
FIG. 5 is a schematic block diagram of a third example power indication circuit. in accordance with embodiments of the preset invention.

Referring now to FIG. 5, shown is a schematic block diagram of a third example power indication circuit, in accordance with embodiments of the preset invention. In this particular example, power indication circuit 5 can include LED indicators Led1-Led4, setting resistors R1-R4, multifunction ports d1-d4, and a drive circuit. The parallel-connected LED indicator Led1 and setting resistor R1 can connect to multifunction port d1, the parallel-connected LED indicator Led2 and setting resistor R2 can connect to multifunction port d2, the parallel-connected LED indicator Led3 and setting resistor R3 can connect to multifunction port d3, and the parallel-connected LED indicator Led4 and setting resistor R4 can connect to multifunction port d4. In the drive circuit, current mirror circuit 32 can include N branches respectively connected to corresponding multi-function ports, and each branch can include a transistor.

The first terminals of the N transistors in the N branches can connect to a pull-up voltage source, the second terminals of the N transistors are connected to common terminal c, and the third terminals of the N transistors may respectively be connected to corresponding multifunction ports. As shown in FIG. 5, current mirror circuit 32 can include four branches: the first branch can include transistor Q1, the second branch can include transistor Q2, the third branch can include transistor Q3, and the fourth branch can include transistor Q4. For example, the first terminal of transistor Q4 can connect to pull-up voltage source VDD, the second terminal of transistor Q4 can connect to common terminal c, and the third terminal of transistor Q4 can connect to the corresponding multi-function port d4.

In particular embodiments, transistors Q1-Q4 can be metal oxide semiconductor field effect transistors (MOSFETs), and current mirror circuit 32 may be a cascade current mirror. Transistors Q1-Q4 may be common gate, and the source terminals of transistors Q1-Q4 can all be connected to pull-up voltage terminal VDD. The drain terminal of the transistor Q1 can connect to multifunction port d1, the drain terminal of transistor Q2 can connect to multifunction port d2, the drain terminal of the transistor Q3 can connect to multifunction port d3, and the drain terminal of the transistor Q4 can connect to multifunction port d4. It should be understood that transistors Q1-Q4 may also be other types of electronically controlled switching devices, for example, bipolar transistors (BJT).

In particular embodiments, the first branch is configured as an input branch of current mirror circuit 32, and the second branch, the third branch, and the fourth branch are configured as output branches of current mirror circuit 32. Further, current mirror circuit 32 can also include comparator P0 and transistor Q0. Comparator p0 and transistor Q0 can connect to the first branch, and transistor Q0 may be controlled to operate in a linear state or linear region of operation. A first input terminal of comparator P0 can connect to multifunction port d1, a second input terminal of comparator P0 can receive reference voltage Vref generated by a reference voltage generation circuit (not shown in FIG. 5), and the output terminal of comparator P0 can connect to the gate terminal of transistor Q0. In this way, current I1 flowing through transistor Q0 can be adjusted by comparator P0 according to reference voltage Vref, that is, the current flowing through the input branch of current mirror circuit 32 can be adjusted according to reference voltage Vref. In order to ensure that LED indicator Led1 correctly indicates the power state of the battery, reference voltage Vref is less than a conduction threshold of LED indicator Led1.

In particular embodiments, power indication circuit 5 can include first switch S11 connected between pull-up voltage source VDD and common terminal c. First switch S11 can be controlled by time-sharing control signal tsc to be turned off during the first time period, such that current mirror circuit 32 may be at the operation state. First switch S11 can be controlled by time-sharing control signal tsc to be turned on during the second time period, such that current mirror circuit 32 may be at the off state. The current ratio between four branches of current mirror circuit 32 may set to be 1:1:1:1, such that the currents flowing through the four branches of current mirror circuit 32 are equal, that is, I1=I2=I3=I4. In the first time period, first switch S11 can be turned off, and current mirror circuit 32 may operate.

As shown in FIG. 5, voltage Vled1 at multi-function port d1 is equal to reference voltage Vref, and input current I1 flowing through the first branch of current mirror circuit 32 is equal to Vref/R1. Since the currents flowing through the four branches of current mirror circuit 32 are equal, voltage Vled2 at multifunction port d2 is equal to R2*I2=R2*Vref/R1, voltage Vled3 at multifunction port d3 is equal to R3*I3=R3*Vref/R1, and voltage Vled4 at multi-function port d4 is equal to R4*I4=R4*Vref/R1. Further, voltage Vled1 at multi-function ports d1 may be less than a conduction threshold of LED indicator Led1, voltage Vled2 at multi-function ports d2 may be less than a conduction threshold of LED indicator Led2, voltage Vled3 at multi-function ports d3 may be less than a conduction threshold of LED indicator Led3, and voltage Vled4 at multi-function ports d4 may be less than a conduction threshold of LED indicator Led4.

The various embodiments may adjust the voltage at the multi-function port connected to each LED indicator by adjusting the resistance value of setting resistor R1, or by adjusting the resistance value of the corresponding setting resistor connected the corresponding multi-function port. In this way, the power detection circuit may be made suitable for batteries with different types and capacities.

In particular embodiments, power indication circuit 5 can further include second switch group 36. Second switch group 36 can include second switches S21-S24. Second switch S21 can connect between multi-function port d1 and power detection circuit 33, second switch S22 can connect between multi-function port d2 and power detection circuit 33, second switch S23 can connect between multi-function port d3 and power detection circuit 33, and second switch S24 can connect between multi-function port d4 and power detection circuit 33. Second switches S21-S24 may be controlled by time-sharing control signal tsc to be turned on during the first time period, in order to form conductive paths between multi-function ports d1-d4 and power detection circuit 33, such that power detection circuit 33 can determine comparison signals sc1-sc4 according to voltages Vled1-Vled4 at multi-function port d1-d4 and voltage detection signal Vba. Second switches S21-S24 can be controlled by time-sharing control signal tsc to be turned off during the second time period, in order to cut off the conductive paths between multi-function ports d1-d4 and power detection circuit 33.

In particular embodiments, power detection circuit 33 can include comparators p1-p4. During the first time period, second switches S21-S24 may all be turned on. Comparator p1 can compare voltage detection signal Vba against threshold voltage signal Vth1 to generate comparison signal sc1, and threshold voltage signal Vth1 is the sum of voltage Vled1 at multi-function port d1 and preset initial threshold value Vos1. Comparator p2 can compare voltage detection signal Vba against threshold voltage signal Vth2 to generate comparison signal sc2, and threshold voltage signal Vth2 is the sum of voltage Vled2 at multi-function port d2 and preset initial threshold value Vos2. Comparator p3 can compare voltage detection signal Vba against threshold voltage signal Vth3 to generate comparison signal sc3, and threshold voltage signal Vth3 is the sum of voltage Vled3 at multi-function port d3 and preset initial threshold value Vos3. Comparator p4 can compare voltage detection signal Vba against threshold voltage signal Vth4 to generate comparison signal sc4, and threshold voltage signal Vth4 is the sum of voltage Vled4 at multi-function port d4 and preset initial threshold value Vos4.

Due to the relatively narrow range of power thresholds of some batteries (e.g., lithium batteries), preset initial thresholds Vos1-Vos4 can be set to reduce the adjustment range of power thresholds of some batteries, thereby reducing the detection deviation caused by circuit errors (e.g., current mirror circuit). For example, preset initial threshold value Vos1 is equal to 83%*Vcv, preset initial threshold value Vos2 is equal to 88%*Vcv, preset initial threshold value Vos3 is equal to 93%*Vcv, and preset initial threshold value Vos4 is equal to 98%*Vcv, where voltage Vcv can be a fixed power supply. Then for example, threshold voltage signal Vth1 is equal to the sum of 83%*Vcv and reference voltage Vref, threshold voltage signal Vth2 is equal to the sum of 88%*Vcv and R2*Vref/R1, threshold voltage signal Vth3 is equal to the sum of 93%*Vcv and R3*Vref/R1, and threshold voltage signal Vth4 is equal to the sum of 98%*Vcv and R4*Vref/R1.

Drive signal generation circuit 34 can generate drive signals dri1-dri4 according to comparison signals sc1-sc4 to drive the LED indicators, in order to indicate the power state of battery BA. Assuming that threshold voltage signal Vth1<Vth2<Vth3<Vth4, when voltage detection signal Vba is less than threshold voltage signal Vth1, comparison signals sc1-sc4 are all low levels, and drive signal generation circuit 34 can generate drive signals dri1-dri4 according to comparison signals sc1-sc4 to drive LED indicators Led1-Led4, such that LED indicator Led1 flashes, and LED indicators Led2-Led4 are not illuminated.

When voltage detection signal Vba is greater than or equal to threshold voltage signal Vth1 and less than threshold voltage signal Vth2, comparison signal sc1 is at a high level, comparison signals sc2-sc4 are all low levels, and drive signal generation circuit 34 can generate drive signalsdri1-dri4 according to comparison signal sc1-sc4 to drive LED indicators Led1-Led4, such that LED indicator Led1 is illuminated, LED indicator Led2 flashes, and LED indicators Led3-Led4 are not illuminated.

When voltage detection signal Vba is greater than or equal to threshold voltage signal Vth2 and less than threshold voltage signal Vth3, comparison signals sc1 and sc2 are both high levels, comparison signals sc3 and sc4 are both low levels, and drive signal generation circuit 34 can generate drive signals dri1-dri4 according to comparison signal sc1-sc4 to drive LED indicators Led1-Led4, such that LED indicators Led1 and Led2 are illuminated, LED indicator Led3 flashes, and LED indicator Led4 is not illuminated.

When voltage detection signal Vba is greater than or equal to threshold voltage signal Vth3 and less than threshold voltage signal Vth4, comparison signals sc1, sc2, and sc3 are all high levels, comparison signal sc4 is low level, and drive signal generation circuit 34 can generate drive signals dri1-dri4 according to comparison signal sc1-sc4 to drive LED indicators Led1-Led4, such that LED indicators Led1-Led3 are illuminated and LED indicator Led4 flashes.

When voltage detection signal Vba is greater than or equal to threshold voltage signal Vth4, comparison signals sc1-sc4 are all high level, and drive signal generation circuit 34 can generate drive signals dri1-dri4 according to comparison signal sc1-sc4 to drive LED indicators Led1-Led4, such that LED indicator Led1-Led4 are all illuminated. It should be understood that the display state of the LED indicators controlled by the drive signal generation circuit may provide a visual indication of the current power lever of battery BA, and those skilled in the art will recognize that other drive signal generation circuit can also be used to achieve the same function. In this embodiment, drive signal generating circuit 34 can operate in the first time period as an example. It should be understood that drive signal generating circuit 34 may also operate in the second time period.

During the second time period, first switch S11 is controlled to be turned on, such that current mirror circuit 32 is turned off, and second switch group 36 is controlled to be turned off so as to cut off the current path between multi-function ports d1-d4 and power detection circuit 33. Control circuit 35 may be controlled to be at the operation state, and can drive LED indicators Led1-Led4 according to drive signals dri1-dri4, such that LED indicators Led1-Led4 can indicate the current power state of the battery.

In particular embodiments, control circuit 34 can include drive switches S1-S4. Drive switch S1 can connect between pull-up voltage source VDD and multi-function port d1, and can be controlled by drive signal dri1 to be turned on and off. Drive switch S2 can connect between pull-up voltage source VDD and multi-function port d2, and can be controlled by drive signal dri2 to be turned on and off. Drive switch S3 can connect between pull-up voltage source VDD and multi-function port d3, and can be controlled by drive signal dri3 to be turned on and off. Drive switch S4 can connect between pull-up voltage source VDD and multi-function port d4, and can be controlled by drive signal dri4 to be turned on and off. In another embodiment, drive switches S1-S4 can connect to a current source to drive the LED indicators, and a corresponding LED indicator can be illuminated when a corresponding drive switch is controlled to be turned on.

In this embodiment, the voltage of pull-up voltage source VDD is greater than the conduction thresholds of LED indicators Led1-Led4. As shown in FIG. 5, when drive switch S1 is turned on, LED indicator Led1 is illuminated, and when drive switch S1 is off, LED indicator Led1 is not illuminated. When drive switch S2 is turned on, LED indicator Led2 is illuminated, and when drive switch S2 is turned off, LED indicator Led2 is not illuminated. When drive switch S3 is turned on, LED indicator Led3 is illuminated, and when drive switch S3 is turned off, LED indicator Led3 is not illuminated. When drive switch S4 is turned on, LED indicator Led4 is illuminated, and when drive switch S4 is turned off, LED indicator Led4 is not illuminated. The various embodiments provide the drive circuit as an integrated circuit that can share pins (e.g., multifunction ports d1-d4) at different time periods, and the integrated circuit is suitable for batteries with different types and capacities on the premise of not increasing the pins, thereby reducing manufacturing costs.

Figure 6:
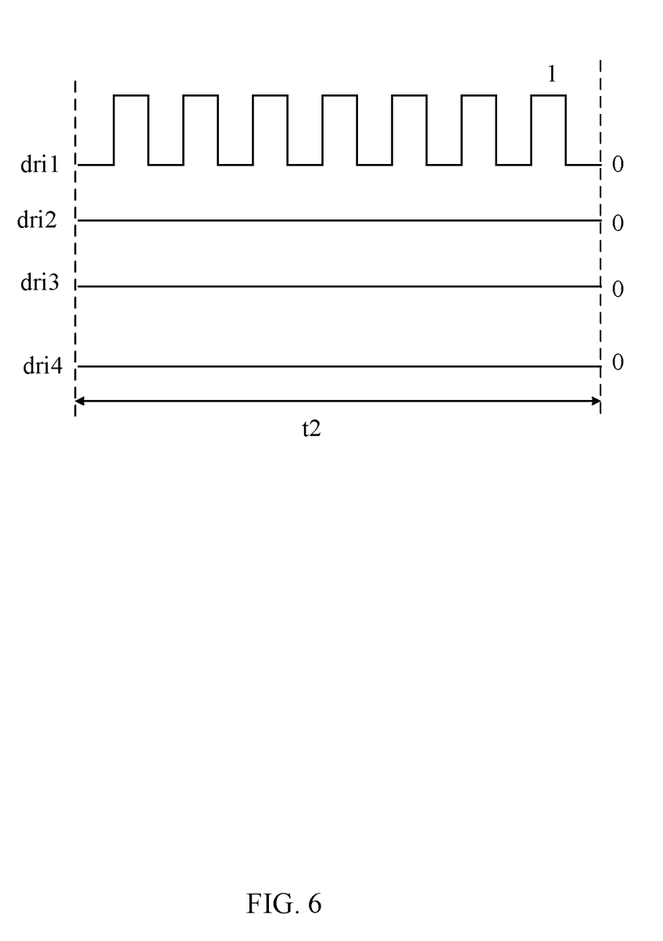
FIG. 6 is a waveform diagram of a first example drive signals, in accordance with embodiments of the preset invention.

Referring now to FIG. 6, shown is a waveform diagram of a first example drive signals, in accordance with embodiments of the preset invention. FIG. 6 shows waveform diagrams of drive signals dri1-dri4 when voltage detection signal Vba is less than threshold voltage signal Vth1. Here, when voltage detection signal Vba is less than threshold voltage signal Vth1, in second time period t2, drive signal dri1 is a pulse signal, and drive signals dri2-dri4 are all low levels, such that LED indicator Led1 flashes, and LED indicators Led2-Led4 are not illuminated.

Figure 7:
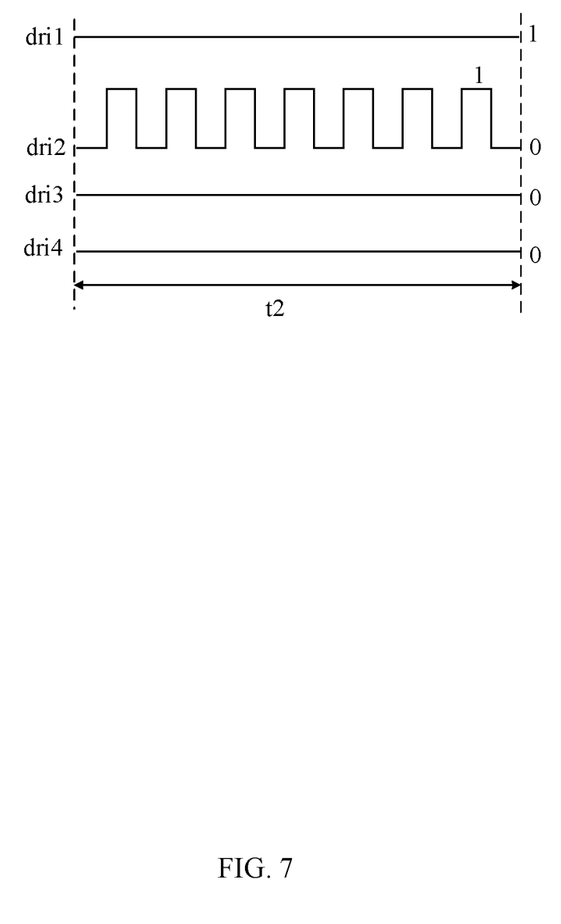
FIG. 7 is a waveform diagram of a second example drive signals, in accordance with embodiments of the preset invention.

Referring now to FIG. 7, shown is a waveform diagram of a second example drive signals, in accordance with embodiments of the preset invention. FIG. 7 shows waveform diagrams of drive signals dri1-dri4 when voltage detection signal Vba is greater than or equal to threshold voltage signal Vth1 and is less than threshold voltage signal Vth2. Here, when voltage detection signal Vba is greater than or equal to threshold voltage signal Vth1 and is less than threshold voltage signal Vth2, in second time period t2, drive signal dri1 is a high level, drive signal dri2 is a pulse signal, and drive signals dri3-dri4 are both low levels, such that LED indicator Led1 is illuminated, LED indicator Led2 flashes, and LED indicators Led3-Led4 are not illuminated.

Figure 8:
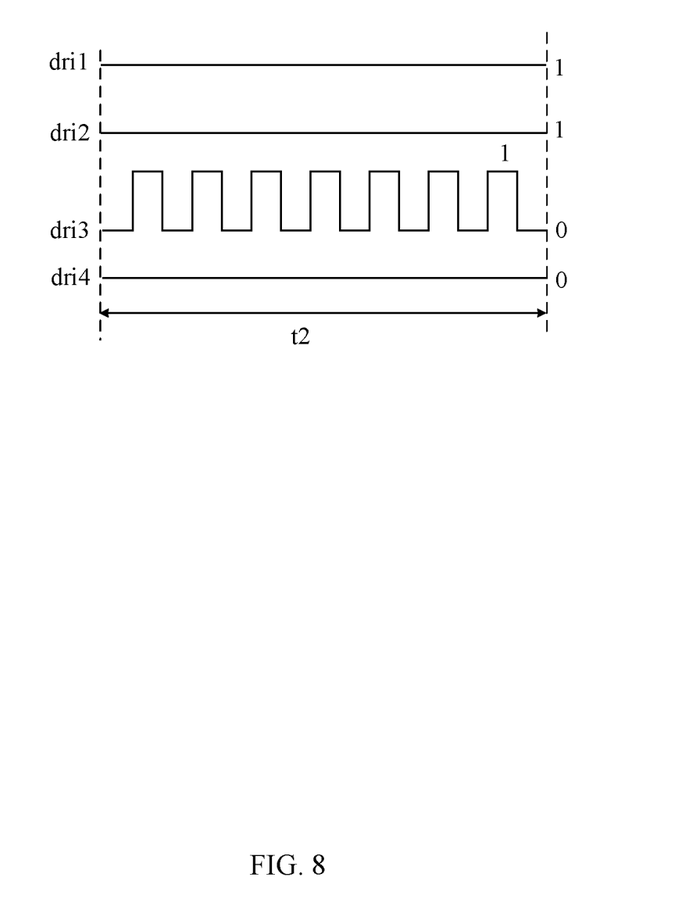
FIG. 8 is a waveform diagram of a third example drive signals, in accordance with embodiments of the preset invention.

Referring now to FIG. 8, shown is a waveform diagram of a third example drive signals, in accordance with embodiments of the preset invention. FIG. 8 shows waveform diagrams of drive signals dri1-dri4 when voltage detection signal Vba is greater than or equal to threshold voltage signal Vth2 and is less than threshold voltage signal Vth3. Here, when voltage detection signal Vba is greater than or equal to threshold voltage signal Vth2 and is less than threshold voltage signal Vth3, in second time period t2, drive signals dri1 and dri2 are both high levels, drive signal dri3 is a pulse signal, and drive signal dri4 is a low level, such that LED indicators Led1 and Led2 are illuminated, LED indicator Led3 flashes, and LED indicator Led4 is not illuminated.

Figure 9:
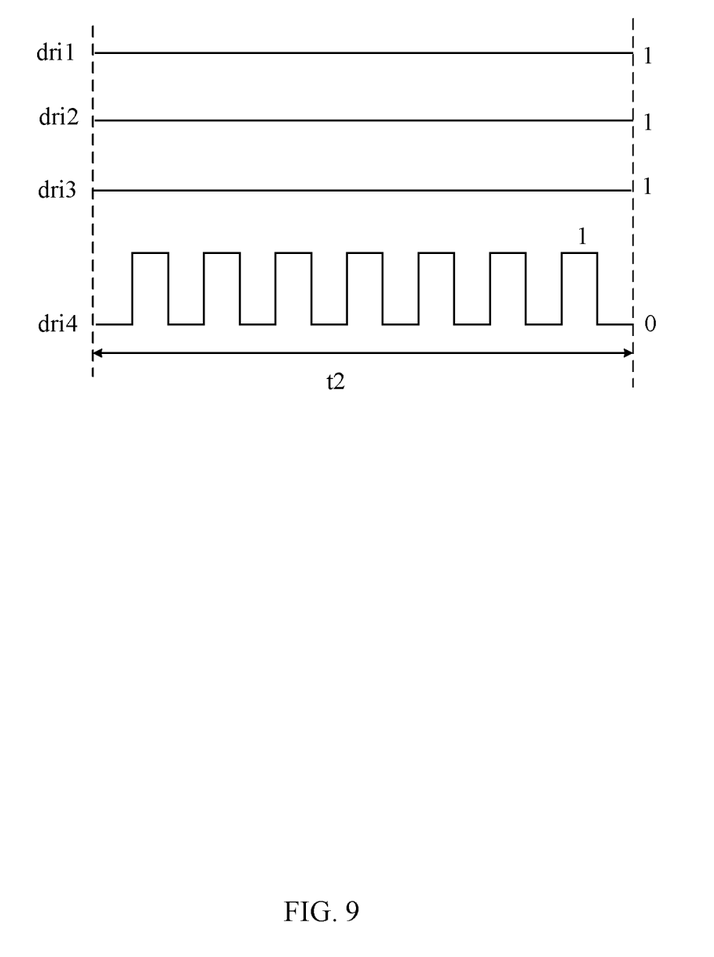
FIG. 9 is a waveform diagram of a fourth example drive signals, in accordance with embodiments of the preset invention.

Referring now to FIG. 9, shown is a waveform diagram of a fourth example drive signals, in accordance with embodiments of the preset invention. FIG. 9 shows waveform diagrams of drive signals dri1-dri4 when voltage detection signal Vba is greater than or equal to threshold voltage signal Vth3 and is less than threshold voltage signal Vth4. Here, when voltage detection signal Vba is greater than or equal to threshold voltage signal Vth3 and is less than threshold voltage signal Vth4, in second time period t2, drive signals dri1-dri3 are all high levels, and drive signal dri4 is a pulse signal, such that LED indicators Led1-Led3 are all illuminated, and LED indicator Led4 flashes.

Figure 10:
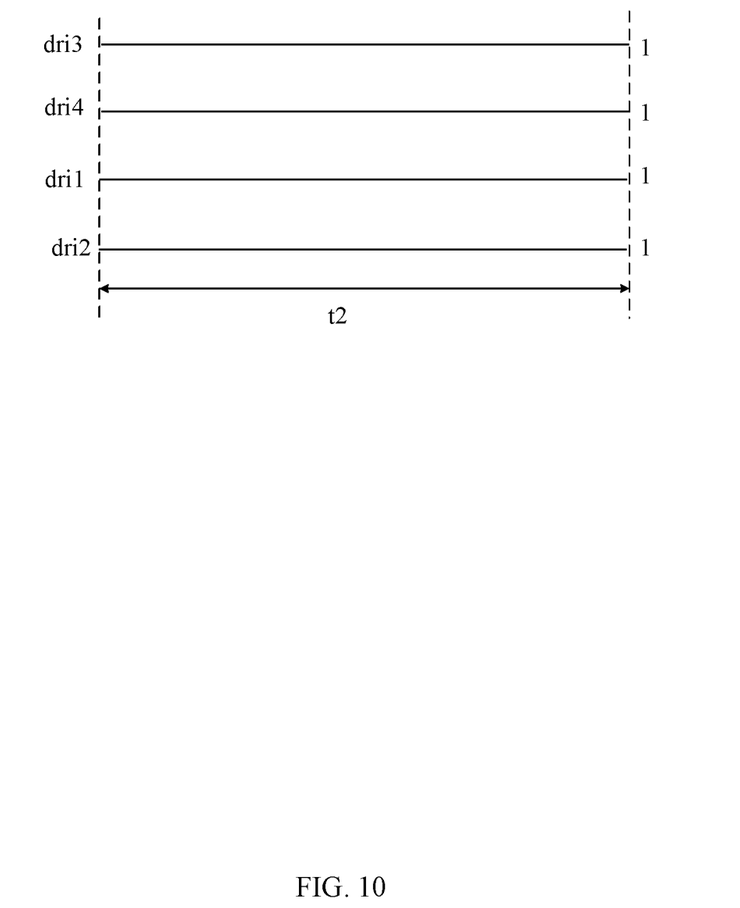
FIG. 10 is a waveform diagram of a fifth example drive signals, in accordance with embodiments of the preset invention.

Referring now to FIG. 10, shown is a waveform diagram of a fifth example drive signals, in accordance with embodiments of the preset invention. FIG. 10 shows waveform diagrams of drive signals dri1-dri4 when voltage detection signal Vba is greater than or equal to threshold voltage signal Vth4. Here, when voltage detection signal Vba is greater than or equal to threshold voltage signal Vth4, in second time period t2, drive signals dri1-dri4 are all high levels, such that LED indicators Led1-Led4 are all illuminated.

For example, if threshold voltage signal Vth1 is equal to 25%*Vba, threshold voltage signal Vth2 is equal to 50%*Vba, threshold voltage signal Vth3 is equal to 75%*Vba, and threshold voltage signal Vth4 is equal to 100%*Vba, the power indication method for indicating different power levels of the battery may be shown in the following table:

| Power levels of the battery: | Range of the voltage detection signal: | Display state of LED indicators: | | | |
|---|---|---|---|---|---|
| | | Led1 | Led2 | Led3 | Led4 |
| 0-25% | <Vth1 | flash | off | off | off |
| 25-50% | Vth1~Vth2 | on | flash | off | off |
| 50-75% | Vth2~Vth3 | on | on | flash | off |
| 75-100% | Vth3~Vth4 | on | on | on | flash |
| 100% | ≥100% | on | on | on | on |

As shown in the above table, the power levels of the battery can correspond to different ranges of the voltage detection signal respectively. Each range of the two adjacent power levels has a common value. The LED indicators can provide a visual indication of the current power lever of the battery. For example, the LED indicators can include four LED indicators: Led1-Led4. Each of the LED indicators is capable of being on in order to illuminate. A number of the LED indicators illuminated correspond to a corresponding power level of the battery in a one-to-one relationship.

It should be understood that the parts of the above power indication circuit except for the LED indicators and the setting resistors can be integrated in the same integrated circuit, and the time-sharing control can realize multiplexing the pins of the integrated circuit. In this way, the integrated circuit is suitable for batteries with different types and capacities by multiplexing the pins of the integrated circuit on the premise of not increasing the pins of the integrated circuit, thereby reducing the manufacturing cost.

Figure 11:
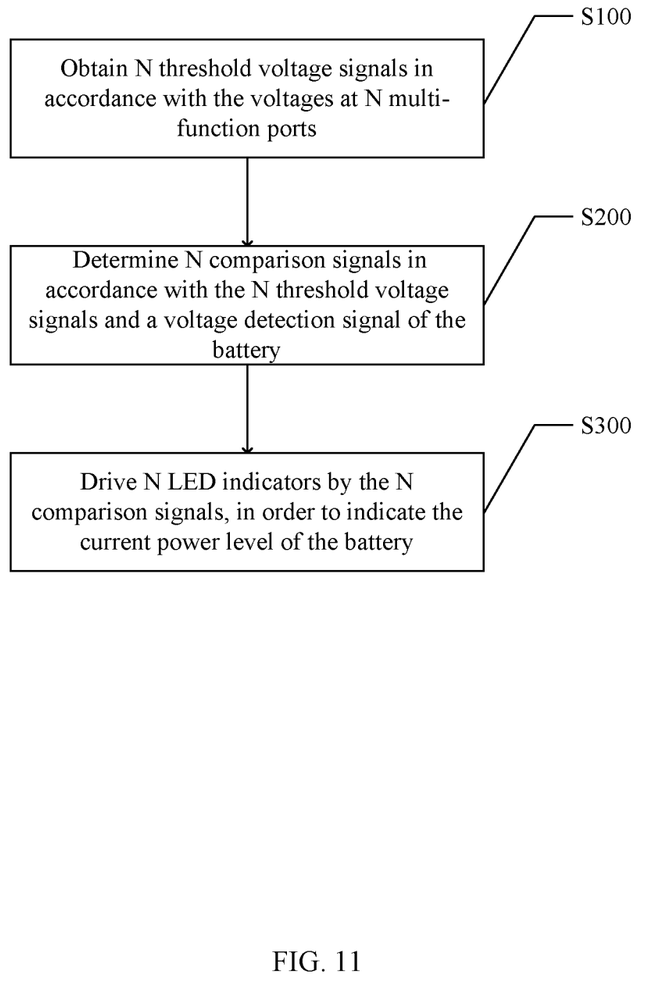
FIG. 11 is a flow diagram of an example power indication method, in accordance with embodiments of the preset invention.

Referring now to FIG. 11, shown is a flow diagram of an example power indication method, in accordance with embodiments of the preset invention. This example power indication method can include, at S100, N threshold voltage signals can be obtained in accordance with the voltages at N multi-function ports. Each of the N threshold voltage signals may be less than a corresponding one of conduction thresholds of the LED indicator. At S200, N comparison signals can be determined in accordance with the N threshold voltage signals and a voltage detection signal of the battery. At S300, N LED indicators may be driven by the N comparison signals, in order to indicate the current power level of the battery.

In particular embodiments, S100 and S200 are executed in a first time period, and S300 is executed in a second time period. At S100, the voltages at the N multifunction ports can be adjusted by adjusting at least one setting resistor. In addition, the threshold voltage signal is the voltage at the corresponding multifunction port. In another embodiment, the threshold voltage signal is the sum of the preset initial threshold value and the voltage at the corresponding multifunction port, in order to reduce the detection deviation caused by circuit errors and improve the accuracy indication of the power level of the battery.

The embodiments can obtain N threshold voltage signals in accordance with the voltages at the N multi-function ports in the first time period, and determine N comparison signals according to the N threshold voltage signals and the voltage detection signal of the battery by utilizing time-sharing control. During the second time period, the LED indicators are driven according to the N comparison signals so as to indicate the current power level of the battery. Therefore, the power indication circuit can be adapted to batteries with different types and capacities, in order to reduce manufacturing costs.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A power indication circuit for indicating different power levels of a battery, the power indication circuit comprising:
    a) N light-emitting diode (LED) indicators, wherein N is positive integer;
    b) N setting resistors;
    c) N multifunction ports;
    d) a drive circuit coupled to the N multifunction ports and the battery, and being configured to acquire N threshold voltage signals in accordance with voltages at the N multifunction ports during a first time period of an operation cycle, and to generate N comparison signals in accordance with the N threshold voltage signals and a voltage detection signal generated by detecting a voltage of the battery, in order to drive the N LED indicators in accordance with the N comparison signals during a second time period of the operation cycle, wherein a path to acquire the N threshold voltage signals is cut off in the second time period of the operation cycle; and
    e) wherein each of the N setting resistors coupled in parallel to a corresponding one of the N LED indicators is respectively coupled to a corresponding one of the N multifunction ports.

2. The power indication circuit of claim 1, wherein each of the voltages at the N multifunction ports is less than a corresponding one of conduction thresholds of the N LED indicators.

3. The power indication circuit of claim 1, wherein the drive circuit is configured to adjust at least one of the N setting resistors so as to adjust at least one voltage at the N multifunction ports.

4. The power indication circuit of claim 1, wherein the drive circuit comprises:
    a) a current mirror circuit comprising N branches, and being configured to generate N currents; and
    b) wherein each of the N branches is coupled to a corresponding one of the N multifunction ports, and each of the N currents flows through a corresponding one of the N multifunction ports.

5. The power indication circuit of claim 4, wherein the current mirror circuit is controlled to be at an operation state during the first time period, and to be out of operation during the second time period.

6. The power indication circuit of claim 5, wherein each of the N branches comprises a transistor having a first terminal coupled to a pull-up voltage source, a second terminal coupled to a common terminal, and a third terminal coupled to a corresponding one of the N multifunction ports.

7. The power indication circuit of claim 6, wherein the drive circuit comprises a first switch coupled between the pull-up voltage source and the common terminal, and being configured to be turned off during the first time period so as to control the current mirror circuit to be at the operation state, and to be turned on during the second time period in order to control the current mirror circuit to be out of operation.

8. The power indication circuit of claim 1, wherein the drive circuit comprises a power detection circuit configured to generate the N comparison signals in accordance with the N threshold voltage signals and the voltage detection signal.

9. The power indication circuit of claim 8, wherein each of the N threshold voltage signals corresponds to a corresponding one of the voltages at the N multifunction ports.

10. The power indication circuit of claim 8, wherein each of the N threshold voltage signals equals the sum of a preset initial threshold and a corresponding one of the voltages at the N multifunction ports.

11. The power indication circuit of claim 8, wherein the power detection circuit comprises N comparators configured to generate the N comparison signals by comparing the N threshold voltage signals against the voltage detection signal respectively.

12. The power indication circuit of claim 8, wherein the drive circuit further comprises:
  a) a drive signal generation circuit configured to generate N drive signals in accordance with the N comparison signals; and
  b) a control circuit configured to drive the N LED indicators in accordance with the N drive signals.

13. The power indication circuit of claim 12, wherein the control circuit comprises N drive switches, each of which coupled between a pull-up voltage source and a corresponding one of the N multifunction ports, and being controlled by a corresponding one of the N drive signals.

14. The power indication circuit of claim 8, wherein the drive circuit further comprises:
  a) a second switch group comprising N second switches; and
  b) wherein each of the N second switches is coupled between the power detection circuit and a corresponding one of the N multifunction ports, and is turned on during the first time period to form a conductive path between the power detection circuit and a corresponding one of the N multifunction ports, and is turned off during the second time period to cut off the conductive path.

15. A method of controlling a power indication circuit comprising N light-emitting diode (LED) indicators, N setting resistors, and N multifunction ports, wherein each of the N setting resistors coupled in parallel to a corresponding one of the N LED indicators is respectively coupled to a corresponding one of the N multifunction port, the method comprising:
  a) obtaining N threshold voltage signals in accordance with voltages at the N multifunction ports;
  b) generating N comparison signals in accordance with the N threshold voltage signals and a voltage detection signal of a battery in a first time period of an operation cycle; and
  c) controlling the N LED indicators in accordance with the N comparison signals in a second time period of the operation cycle, in order to indicate the current power level of the battery, wherein N is a positive integer, wherein a path to acquire the N threshold voltage signals is cut off in the second time period of the operation cycle.

16. The method of claim 15, wherein each of the voltages at the N multifunction port is less than a corresponding one of conduction thresholds of the N LED indicators.

17. The method of claim 15, wherein at least one of the N setting resistors is adjusted to adjust at least one of the voltages at the N multifunction ports.

18. The method of claim 15, wherein each of the N threshold voltage signals corresponds to a corresponding one of the voltages at the N multifunction ports.

19. The method of claim 15, wherein each of the N threshold voltage signals equals the sum of a preset initial threshold and a corresponding one of the voltages at the N multifunction ports.

\* \* \* \* \*